(12) United States Patent
Zheng

(10) Patent No.: US 11,237,209 B2
(45) Date of Patent: Feb. 1, 2022

(54) TESTING DEVICE AND TESTING METHOD FOR TFT ARRAY SUBSTRATE

(71) Applicant: Shenzhen China Star Optoelectronics Semiconductor Display Technology Co., Ltd., Shenzhen (CN)

(72) Inventor: Yalan Zheng, Shenzhen (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 344 days.

(21) Appl. No.: 16/319,824

(22) PCT Filed: Sep. 27, 2018

(86) PCT No.: PCT/CN2018/108085
§ 371 (c)(1),
(2) Date: Jan. 23, 2019

(87) PCT Pub. No.: WO2020/019493
PCT Pub. Date: Jan. 30, 2020

(65) Prior Publication Data
US 2021/0116495 A1 Apr. 22, 2021

(30) Foreign Application Priority Data

Jul. 24, 2018 (CN) .......................... 201810821040.0

(51) Int. Cl.
*G01R 31/28* (2006.01)
*G01R 31/311* (2006.01)

(52) U.S. Cl.
CPC ..... *G01R 31/2887* (2013.01); *G01R 31/2893* (2013.01); *G01R 31/311* (2013.01)

(58) Field of Classification Search
CPC .............. G01R 31/2887; G01R 31/311; G01R 31/2893
See application file for complete search history.

(56) References Cited

U.S. PATENT DOCUMENTS

2003/0156280 A1* 8/2003 Reinhorn ............. G02B 27/144
356/237.2
2005/0035311 A1* 2/2005 Asakawa ............. G02F 1/1309
250/559.16

(Continued)

FOREIGN PATENT DOCUMENTS

| CN | 101501516 A | 8/2009 |
| CN | 102375252 A | 3/2012 |
| CN | 106950485 A | 7/2017 |

Primary Examiner — Akm Zakaria
(74) Attorney, Agent, or Firm — Leong C. Lei

(57) ABSTRACT

Apparatus for testing microelectronic components on a substrate, including a scanner operative to scan a light beam over a plurality of thin film transistors disposed on a substrate, one transistor at a time, so as to induce a photoconductive response in the plurality of transistors, one transistor at a time; current sensing circuitry operative, synchronously with said scanner, to measure an output induced by the photoconductive response associated with a transistor and to generate photoconductive response output values, the photoconductive response output values representing a photoconductive response induced by the light beam, for one transistor at a time from among the plurality of transistors; and diagnostic apparatus operative to analyze the electronic response output values and to characterize each of the transistors in accordance therewith.

2 Claims, 3 Drawing Sheets

(56) References Cited

U.S. PATENT DOCUMENTS

2010/0155574 A1\* 6/2010 Choi .................. G01J 1/08
250/205
2018/0031614 A1\* 2/2018 Nakamura .......... G01R 15/245

\* cited by examiner

TESTING DEVICE AND TESTING METHOD FOR TFT ARRAY SUBSTRATE

BACKGROUND OF THE INVENTION

1. Field of the Invention

The present invention relates to the field of display and, in particular, to the field of a testing device and testing method for thin film transistor (TFT) array substrate.

2. The Related Arts

As the display technologies progress, the liquid crystal display (LCD) and the organic light-emitting diode (OLED) display, with many advantages such as high image quality, power saving, thinness and wide application range, are widely used in various consumer electronic products such as mobile phones, televisions, personal digital assistants, digital cameras, notebook computers, desktop computers, and so on, and have become the mainstream in the display device.

Most of the LCDs on the existing market are backlight type LCD, which comprises an LCD panel and a backlight module. The working principle of the LCD panel is to fill liquid crystal (LC) molecules between a TFT array substrate and a color filter (CF) substrate, and apply a driving voltage on two substrates. The driving voltage controls the rotation direction of the LC molecules to refract the light of the backlight module to generate an image.

When the LCD is in operation, since the backlight module emits a backlight to the LCD panel, the TFT device on the TFT array substrate is irradiated by the backlight to generate photogenerated carriers, which affects the switching leakage performance of the TFT device. Therefore, when the TFT array substrate is fabricated in the prior art, a solution for detecting the switching characteristics of the TFT device in the TFT substrate is provided. When performing this test, a backlight is required to illuminate the TFT device to generate photogenerated carriers to simulate a real TFT device working environment. At present, the backlight is generally disposed inside an existing panel performance tester (TEG) to implement a photogenerated carrier environment, and a plurality of test components are disposed on the TFT array substrate. The test components are generally disposed outside the active area of the TFT array substrate, and the test components are formed simultaneously with the switching TFT device in each pixel of the TFT array substrate. Thus, the photogenerated carrier characteristics thereof are consistent with the photogenerated carrier characteristics of the switching TFT device in each pixel of the TFT array substrate. Therefore, the test performed on the photogenerated carrier interference detection on the test component can obtain the photogenerated carrier characteristics of the switching TFT device in each pixel of the TFT array substrate. When performing photogenerated carrier interference detection, the test component is placed above the backlight, thereby obtaining the generation condition of photogenerated carriers of the test component to reflect the photogenerated carrier characteristics of the switching TFT device in each pixel. However, in this design, the cost of installing the backlight is high, and at the same time, the backlight cannot be flexibly moved, which would easily cause the problem that the test components at certain positions on the TFT array substrate are not located above the backlight, and the photogenerated carrier operation environment cannot be effectively realized. Also, because the distribution of test components on different types of TFT array substrates is quite different, the fixed backlight cannot meet the testing requirements of different TFT array substrates.

SUMMARY OF THE INVENTION

The primary object of the present invention is to provide a testing device for TFT array substrate, able to perform photogenerated carrier interference detection on test elements at different positions on the TFT array substrate, and at a low cost.

Another object of the present invention is to provide a testing method for TFT array substrate, able to perform photogenerated carrier interference detection on test elements at different positions on the TFT array substrate, and easy to operate.

To achieve the above objects, the present invention provides a testing device for TFT array substrate, which comprises: a loading platform, a test module disposed above the loading platform, and a driving module connected to the test module;

the test module comprising a vertical probe head disposed above the loading platform, a connection portion disposed on one side of the probe head, a probe card disposed at a side of the connection portion away from the probe head, an image acquisition module disposed above the loading platform, and a frame connecting the probe head and the image acquisition module, wherein the frame being connected to the driving module;

the image acquisition module being located above the probe card; the image acquisition module comprising a lens connected to the frame and a light source disposed at an end of the lens near the loading platform;

the loading platform being configured to place a TFT array substrate; one side of the TFT array substrate being disposed with a test component, and after placing the TFT array substrate on the loading platform, the side of the TFT array substrate disposed with the test component facing upward;

the driving module being configured to drive the movement of the frame to drive the probe head, the connection portion, the probe card and the image acquisition module to move, so that the probe card being in contact with the test component to electrically connect the probe card to the test component;

the image acquisition module being configured to illuminate the test component with the light source;

the probe card being configured to detect a current flowing through the test component after being electrically connected to the test component.

The probe card comprises a body disposed on a side of the connection portion away from the probe head, and a probe disposed at an end of the body away from the probe head and extending in a direction approaching the loading platform.

The body is parallel to a horizontal plane.

The image acquisition module is located above the probe.

The light source is an annular light source.

The image acquisition module is a CCD camera, and the lens is a CCD lens.

The loading platform comprises a base and a support disposed under the base; the test module is located above the base.

The frame is disposed above the probe head and the image acquisition module.

The present invention also provides a testing method for TFT array substrate, applicable to the above testing device for TFT array substrate, comprising the following steps:

Step S1: providing a TFT array substrate; one side of the TFT array substrate being provided with a test component; and the TFT array substrate being placed on the loading platform so that the side of the TFT array substrate with the test component facing upward;

Step S2: the driving module driving the frame to move the probe head, the connection portion, the probe card and the image acquisition module to move, so that the probe card contacting the test component to electrically connect the probe card to the test component;

Step S3: the image acquisition module using the light source to illuminate the test component;

Step S4: the probe card detecting the current flowing through the test component.

In the step S2, the driving module drives the frame to move the probe head, the connection portion, the probe card and the image acquisition module to move, so that the probe of the probe card contacts the test component to electrically connect the probe card to the test component.

The present invention provides the following advantages: the testing device for TFT array substrate of the present invention comprises a loading platform, a test module and a driving module. The test module comprises a probe head, a connection part, a probe card, an image acquisition module and a frame, and the image acquisition module comprises a light source. When testing, the TFT array substrate is placed on the loading platform so that the test component on the TFT array substrate faces upward, and the drive module drives the frame to move the probe head, the connection portion, the probe card and the image acquisition module to move the probe card to contact the test component, the image acquisition module uses the light source to illuminate the test component, and the probe card detects the current flowing through the test component, thereby enabling photogenerated carrier interference detection on the test components at different positions on the TFT array substrate. The device has a lower cost. The testing method for TFT array substrate of the present invention can perform photogenerated carrier interference detection on every type of TFT array substrate, and is easy to operate.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort.

DETAILED DESCRIPTION OF THE PREFERRED EMBODIMENTS

To further explain the technical means and effect of the present invention, the following refers to embodiments and drawings for detailed description. Apparently, the described embodiments are merely some embodiments of the present invention, instead of all embodiments. All other embodiments based on embodiments in the present invention and obtained by those skilled in the art without departing from the creative work of the present invention are within the scope of the present invention.

Figure 1:
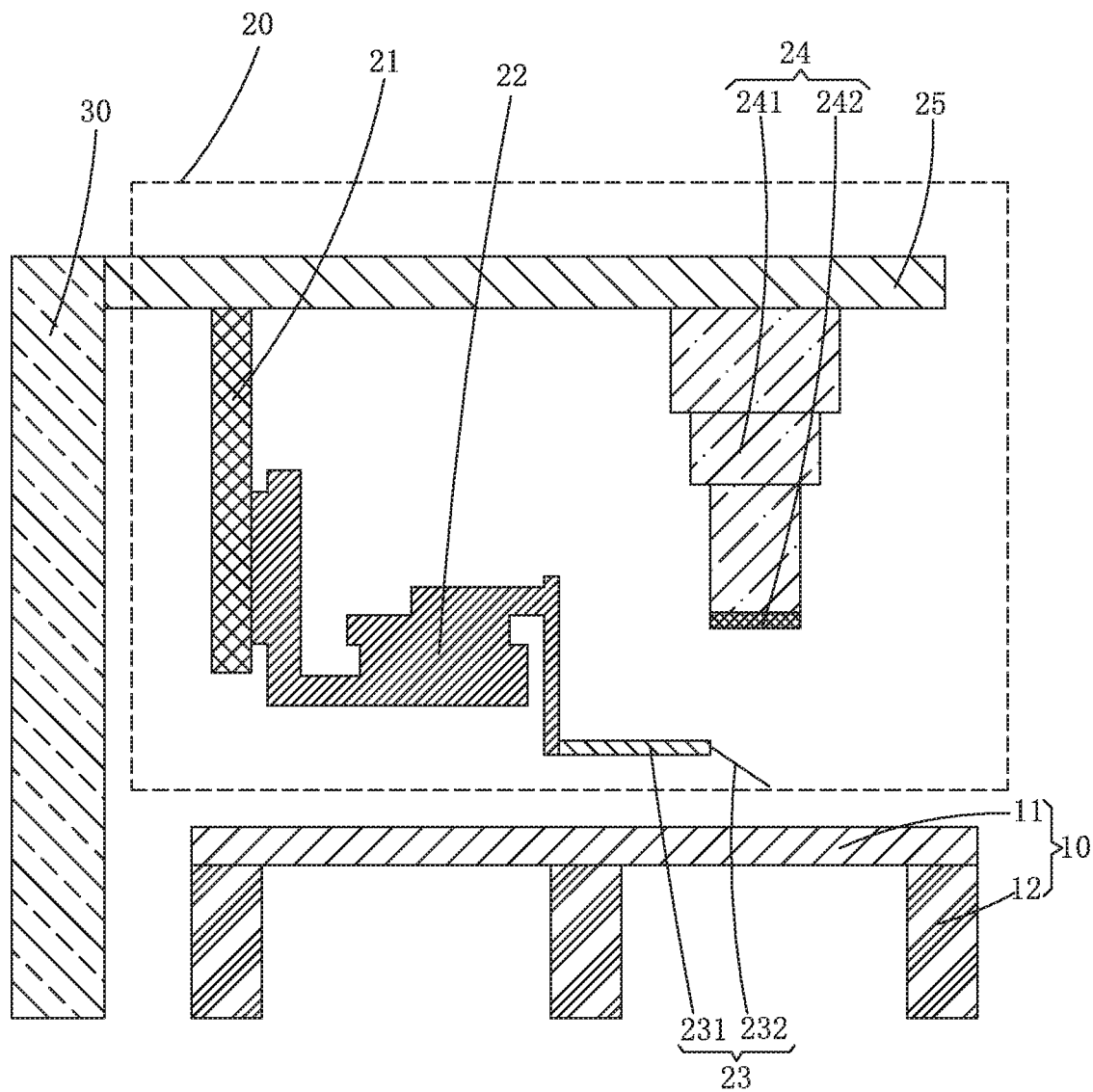
FIG. 1 is a schematic cross-sectional view showing the structure of a testing device for TFT array substrate of the present invention.

Refer to FIG. 1. The testing device for TFT array substrate of the present invention comprises: a loading platform 10, a test module 20 disposed above the loading platform 10, and a driving module 30 connected to the test module 20.

The test module 20 comprises a vertical probe head 21 disposed above the loading platform 10, a connection portion 22 disposed on one side of the probe head 21, a probe card 23 disposed at a side of the connection portion 22 away from the probe head 21, an image acquisition module 24 disposed above the loading platform 10, and a frame 25 connecting the probe head 21, and the image acquisition module, wherein the frame 25 is connected to the driving module 30.

The image acquisition module 24 is located above the probe card 23; the image acquisition module 24 comprises a lens 241 connected to the frame 25 and a light source 242 disposed at an end of the lens 241 near the loading platform 10.

Figure 3:
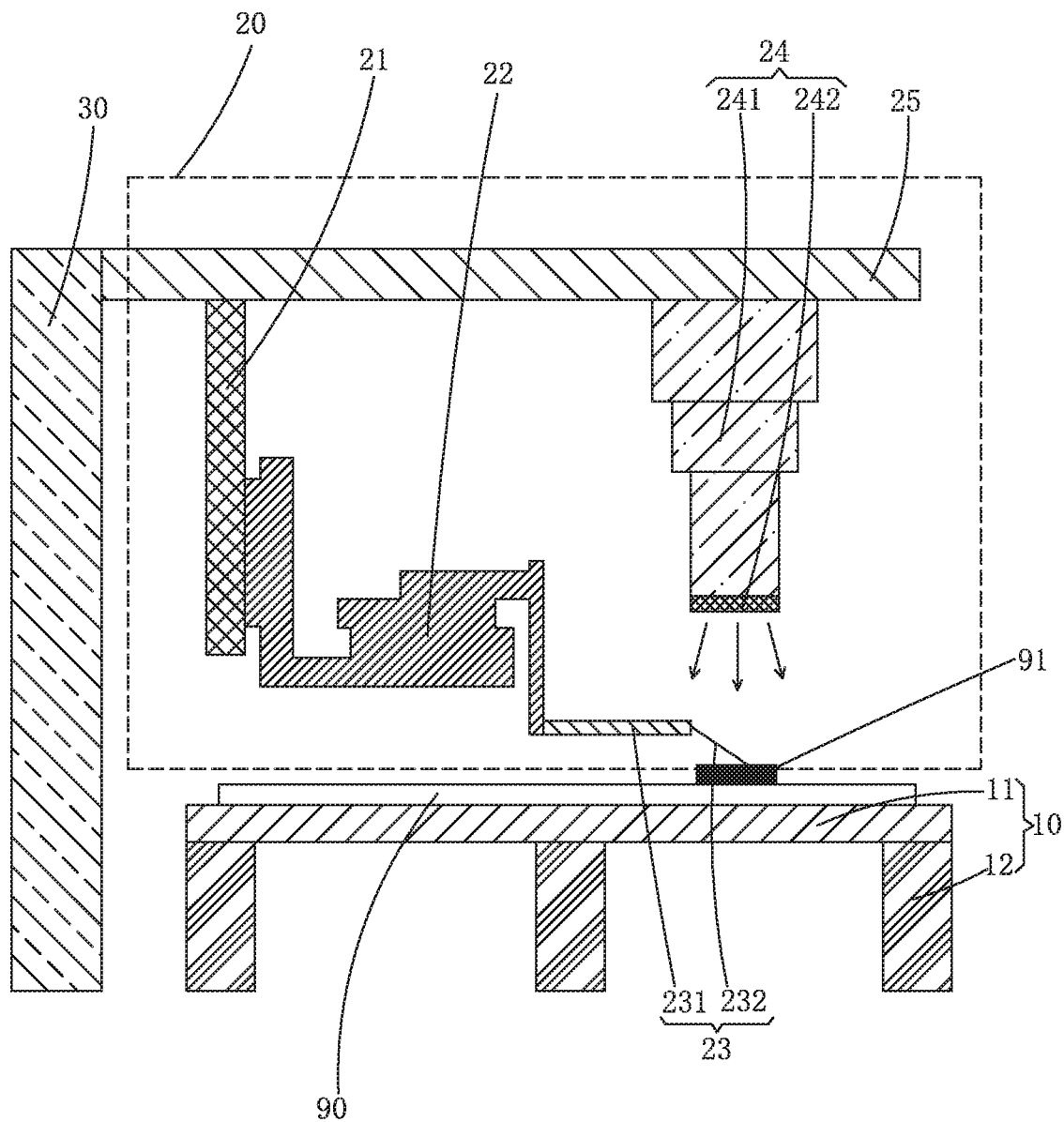
FIG. 3 is a schematic view showing step S3 and step S4 of the testing method for TFT array substrate of the present invention.

Referring to FIG. 3, the loading platform 10 is configured to place a TFT array substrate 90. One side of the TFT array substrate 90 is disposed with a plurality of pixels (not shown) and a test component 91. Each pixel comprises a switching TFT device, and the switching TFT devices of the plurality of pixels are simultaneously formed with the test component 91 so that the photogenerated carrier characteristics of the plurality of test components 91 and the photogenerated carrier characteristics of the switching TFT devices in the respective pixels are the same. The photogenerated carrier characteristics of the switching TFT device in each pixel of the TFT array substrate 90 can be obtained by performing photogenerated carrier interference detection on the test component 91. After placing the TFT array substrate on the loading platform 10, the side of the TFT array substrate 90 disposed with the test component 91 faces upward.

The driving module 30 is configured to drive the movement of the frame 25 to drive the probe head 21, the connection portion 22, the probe card 23 and the image acquisition module 24 to move, so that the probe card 23 is in contact with the test component 91 to electrically connect the probe card 23 to the test component 91.

The image acquisition module 24 is configured to illuminate the test component 91 with the light source 242.

The probe card 23 is configured to detect a current flowing through the test component 91 after electrically connected to the test component 91.

Specifically, the probe card 23 comprises a body 231 disposed on a side of the connection portion 22 away from the probe head 21, and a probe 232 disposed at an end of the body 231 away from the probe head 21 and extending in a direction approaching the loading platform 10.

Specifically, the image acquisition module 24 is located above the probe 232.

Preferably, the body 231 is parallel to a horizontal plane.

Specifically, the light source 242 is an annular light source.

Specifically, the image acquisition module 24 is a charge-coupled device (CCD) camera, and the lens 241 is a CCD lens.

Specifically, the loading platform 10 comprises a base 11 and a support 12 disposed under the base 11; the test module 20 is located above the base 11.

Preferably, the frame 25 is disposed above the probe head 21 and the image acquisition module 24.

Referring to FIG. 3, in the testing device for TFT array substrate of the present invention, when testing the TFT array substrate 90, the TFT array substrate 90 is first placed on the base 11 of the loading platform 10, and the side of the TFT array substrate 90 provided with the test component 91 faces upward. Then, the driving module 30 drives the frame 25 to move the probe head 21, the connection portion 22, the probe card 23 and the image acquisition module 24 to move, so that the probe card 23 is in contact with the test component 91 to make the probe card 23 electrically connected to the test component 91. Specifically, the probe 232 of the probe card 23 is in contact with the test component 91 to electrically connect the probe card 23 to the test component 91. Since the image acquisition module 24 is located above the probe card 23, after the probe card 23 is in contact with the test component 91, the image acquisition module 24 is positioned above the test component 91. Then, the image acquisition module 24 illuminates the test component 91 with the light source 242 to implement a photogenerated carrier environment to cause the test element 91 to generate a current. The probe card 23 detects the current flowing through the test element 91 through the probe 232 to obtain the photogenerated carrier characteristics of the test element 91 for reflecting the photo-generated carrier characteristics of the switching TFT device of each pixel in the TFT array substrate 90 so as to realize the photogenerated carrier interference detection on the TFT array substrate 90. The lighting conditions can be controlled by adjusting the illumination intensity of the light source 242 and the distance between the lens 241 and the TFT array substrate 90. Since the image acquisition module 24 moves as the probe head 21 and the probe card 23 to above the test component 91 to be tested, the present invention can perform photogenerated carrier interference detection for the test component 91 at any position on the TFT array substrate 90. Moreover, the present invention can perform photogenerated carrier interference detection on different types of TFT array substrates 90 having different test component 91 layout, and the present invention has a simple structure and a low cost compared to the prior art using a full-surface backlight.

Figure 2:
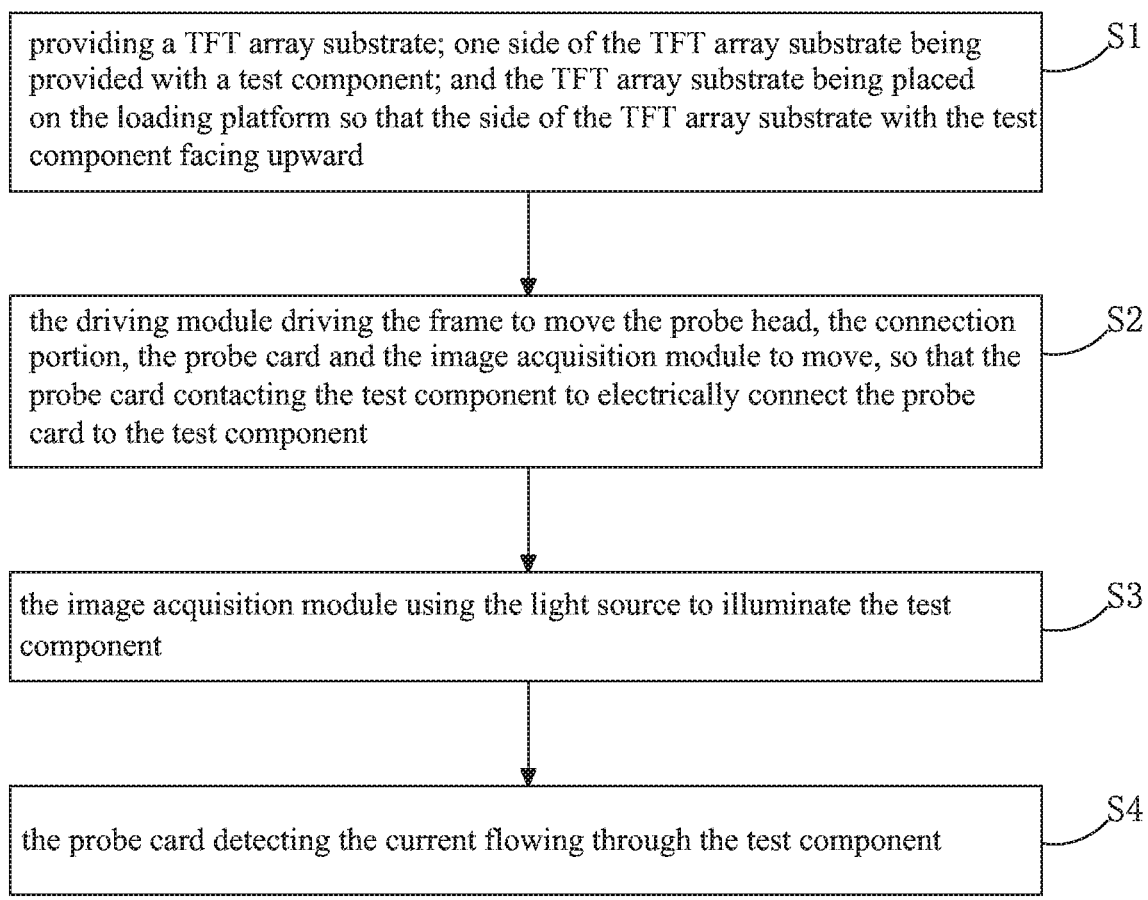
FIG. 2 is a schematic view showing the flowchart of a testing method for TFT array substrate of the present invention.

Refer to FIG. 2. The present invention also provides a testing method for TFT array substrate, applicable to the above testing device for TFT array substrate, comprising the following steps:

Step S1: referring to FIG. 3, providing a TFT array substrate 90; one side of the TFT array substrate 90 being provided with a plurality of pixels and a test component 91. Each pixel comprises a switching TFT device, and the switching TFT devices of the plurality of pixels are simultaneously formed with the test component 91 so that the photogenerated carrier characteristics of the plurality of test components 91 and the photogenerated carrier characteristics of the switching TFT devices in the respective pixels are the same. The photogenerated carrier characteristics of the switching TFT device in each pixel of the TFT array substrate 90 can be obtained by performing photogenerated carrier interference detection on the test component 91. After placing the TFT array substrate on the loading platform 10, the side of the TFT array substrate 90 disposed with the test component 91 faces upward.

Specifically, in step S1, the TFT array substrate is placed on the base 11 of the loading platform.

Step S2: referring to FIG. 3, the driving module 30 driving the frame 25 to move the probe head 21, the connection portion 22, the probe card 23 and the image acquisition module 24 to move, so that the probe card 23 contacting the test component 91 to electrically connect the probe card 23 to the test component 91.

Specifically, in step S2, the driving module 30 drives the frame 25 to move the probe head 21, the connection portion 22, the probe card 23 and the image acquisition module 24 to move, so that the probe 232 of the probe card 23 contacts the test component 91 to electrically connect the probe card 23 to the test component 91.

Step S3: referring to FIG. 3, the image acquisition module 24 using the light source 242 to illuminate the test component 91 to realize photogenerated carrier environment to cause the test component to generate a current.

Specifically, the lighting conditions can be controlled by adjusting the illumination intensity of the light source 242 and the distance between the lens 241 and the TFT array substrate 90.

Step S4: the probe card 23 detecting the current flowing through the test component 91. to obtain the photogenerated carrier characteristics of the test element 91 for reflecting the photo-generated carrier characteristics of the switching TFT device of each pixel in the TFT array substrate 90 so as to realize the photogenerated carrier interference detection on the TFT array substrate 90.

Specifically, in step S4, the probe card 23 detects the current flowing through the test component 91 through the probe 232.

It should be noted that the testing method for TFT array substrate of the resent invention uses the driving module 30 to drive the frame 25 to move the probe head 21, the connection portion 22, the probe card 23 and the image acquisition module 24 to move, the image acquisition module 24 moves as the probe head 21 and the probe card 23 to above the test component 91 to be tested, the present invention can perform photogenerated carrier interference detection for the test component 91 at any position on the TFT array substrate 90, and can perform photogenerated carrier interference detection on different types of TFT array substrates 90 having different test component 91 layout. The present invention is easy to operate.

In summary, the testing device for TFT array substrate of the present invention comprises a loading platform, a test module and a driving module. The test module comprises a probe head, a connection part, a probe card, an image acquisition module and a frame, and the image acquisition module comprises a light source. When testing, the TFT array substrate is placed on the loading platform so that the test component on the TFT array substrate faces upward, and the drive module drives the frame to move the probe head, the connection portion, the probe card and the image acquisition module to move the probe card to contact the test component, the image acquisition module uses the light source to illuminate the test component, and the probe card detects the current flowing through the test component, thereby enabling photogenerated carrier interference detection on the test components at different positions on the TFT array substrate. The device has a lower cost. The testing method for TFT array substrate of the present invention can perform photogenerated carrier interference detection on every type of TFT array substrate, and is easy to operate.

It should be noted that each of the embodiments in this specification is described in a progressive manner, each of which is primarily described in connection with other embodiments with emphasis on the difference parts, and the same or similar parts may be seen from each other. For the device embodiment, since it is substantially similar to the method embodiment, the description is relatively simple and the relevant description may be described in part of the method embodiment.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A testing method for TFT array substrate, comprising:
   Step S1: providing a TFT array substrate, wherein one side of the TFT array substrate is provided with a test component; and the TFT array substrate is placed on a loading platform so that the side of the TFT array substrate with the test component faces upward;
   Step S2: providing a driving module driving a frame to move a probe head, a connection portion, a probe card and an image acquisition module to move, so that the probe card is brought into contact with the test component to electrically connect the probe card to the test component;
   Step S3: the image acquisition module using a light source to illuminate the test component; and
   Step S4: the probe card detecting current flowing through the test component.

2. The testing method for TFT array substrate as claimed in claim 1, wherein in step S2, the driving module drives the frame to move the probe head, the connection portion, the probe card and the image acquisition module to move, so that the probe of the probe card contacts the test component to electrically connect the probe card to the test component.

* * * * *